United States Patent
Myles

(10) Patent No.: US 9,231,542 B1
(45) Date of Patent: Jan. 5, 2016

(54) AMPLIFIER COMMON-MODE CONTROL METHOD

(71) Applicant: Dialog Semiconductor (UK) Limited, Reading (GB)

(72) Inventor: Andrew Myles, Edinburgh (GB)

(73) Assignee: Dialog Semiconductor (UK) Limited, Reading (GB)

( * ) Notice: Subject to any disclaimer, the term of this patent is extended or adjusted under 35 U.S.C. 154(b) by 0 days.

(21) Appl. No.: 14/551,324

(22) Filed: Nov. 24, 2014

(51) Int. Cl.
*H03F 3/45* (2006.01)
*H03F 1/42* (2006.01)

(52) U.S. Cl.
CPC .............. *H03F 3/45636* (2013.01); *H03F 1/42* (2013.01); *H03F 2200/372* (2013.01); *H03F 2203/45116* (2013.01)

(58) Field of Classification Search
USPC .................................................. 330/258, 260
IPC .......................................................... H03F 3/45
See application file for complete search history.

(56) References Cited

U.S. PATENT DOCUMENTS

| 5,084,683 | A | 1/1992 | Nicollini |
| RE35,379 | E | 11/1996 | Nicollini |
| 5,914,638 | A | * 6/1999 | He .................... G11C 27/026 327/96 |
| 6,316,970 | B1 | * 11/2001 | Hebert ................ H03F 3/45506 327/560 |
| 6,417,728 | B1 | 7/2002 | Baschirotto et al. |
| 6,429,700 | B1 | 8/2002 | Yang |
| 6,642,788 | B1 | 11/2003 | Abughazaleh |
| 7,138,865 | B1 | 11/2006 | Murden, II et al. |
| 7,365,600 | B1 | 4/2008 | Lokere |
| 8,552,801 | B2 | 10/2013 | Myles |
| 8,633,765 | B2 | 1/2014 | Fant et al. |
| 2004/0169555 | A1 | * 9/2004 | Confalonieri ....... H03F 3/45937 330/69 |
| 2008/0143439 | A1 | * 6/2008 | Tanimoto ............ H03F 3/45183 330/253 |
| 2009/0251216 | A1 | * 10/2009 | Giotta ................. H03F 3/45179 330/258 |
| 2010/0052785 | A1 | * 3/2010 | Ishii ........................ H03F 1/26 330/253 |
| 2012/0154048 | A1 | 6/2012 | Myles |

OTHER PUBLICATIONS

"A Fully Balanced Pseudo-Differential OTA With Common-Mode Feedforward and Inherent Common-Mode Feedback Detector," by Ahmaed Nader Mohieldin, et al., IEEE Journal of Solid-State Circuits, vol. 38, No. 4, Apr. 2003, pp. 663-668.

(Continued)

*Primary Examiner* — Patricia T Nguyen
(74) *Attorney, Agent, or Firm* — Saile Ackerman LLC; Stephen B. Ackerman

(57) ABSTRACT

A fully differential amplifier performs common-mode voltage control while having reduced sensitivity to random offsets and mismatches and improved common-mode control loop bandwidth. The amplifier disclosed comprises an additional common-mode control sub-amplifier, which senses common-mode voltage of the fully differential main amplifier at nodes within the continuous-time signal path feedback network, compares the common-mode voltage sensed with a reference voltage, and regulates depending on the result of the comparison the output common-mode voltage via the existing continuous signal path feedback network. Furthermore the internal common-mode control can be implemented in such a manner as to provide a feed-forward transconductance function in addition to common-mode control if desired. Moreover it is possible to use feedback from other amplifier stages in an amplifier chain to implement common-mode feedback.

11 Claims, 3 Drawing Sheets

(56) References Cited

OTHER PUBLICATIONS

"Continuous-Time Common-Mode Feedback for High-Speed Switched-Capacitor Networks," by David Hernandez-Garduno, et al., IEEE Journal of Solid-State Circuits, vol. 40, No. 8, Aug. 2005, pp. 1610-1617.

"A Power Optimized Continuous-Time ΔΣ ADC for Audio Applications," by Shanthi Pavan, et al., IEEE Journal of Solid-State Circuits, vol. 43, No. 2, Feb. 2008, pp. 351-360.

"Gain-Enhanced Feedforward Path Compensation Technique for Pole-Zero Cancellation at Heavy Capacitive Loads," by P. K. Chan, et al., IEEE Transactions on Circuits and Systems-II, Analog and Digital Signal Processing, vol. 50, No. 12, Dec. 2003, pp. 933-941.

"A Robust Feedforward Compensation Scheme for Multistate Operational Transconductance Amplifiers With No Miller Capacitors," by Bharath Kumar Thandri, et al., IEEE Journal of Solid-State Circuits, vol. 38, No. 2, Feb. 2006, pp. 237-243.

Analog Design Essentials, by Willy M. C. Sansen, Published by Springer, copyright 2008, pp. 240-259, ISBN-13 978-0-387-25746-4.

"1 V fully balanced differential amplifiers: Implementation and experimental results," by Herve Facpong Achigui, et al., Analog Intergr. Circ. Sig. Process, vol. 53, Issue 1, Oct. 2007, pp. 19-25.

"Design Techniques for Fully Differential Amplifiers," by J. Haspeslagh, et al., IEEE ,1988 Custom Integrated Circuits Conference, May 16-19, 1988, pp. 12.2.1-12.2.4.

"A General Description of Common-Mode Feedback in Fully-Differential Amplifiers," by P.M. VanPeteghem, et al., Circuits and System, IEEE International Symposium 1990, May 1-3, 1990, pp. 3209-3212.

"Feedback vs feedforward common-mode control: a comparative study," by J.M. Carrillo, et al., Electronics, Circuits and Systems, 1998, IEEE International Conference, vol. 2, Sep. 7-10, 1998, pp. 363-366.

"A Low Voltage Operational Transconductance Amplifier using Common Mode Feedforward for High Frequency Switched Capacitor Circuits," by A. Shanker, et al., Circuits and Systems, ISCAS 2001, The 2001 IEEE International Symposium vol. 1, May 6-9, 2001, pp. 643-646.

"A Switched-OPAMP With Fast Common Feedback," by Mikko Waltari, et al., Electronics, Circuits and Systems, 1999, Proceedings of ICECS '99, The 6th IEEE International Conference (vol. 3), Sep. 5-8, 1999, pp. 1523-1525.

"Common Mode Stability in Fully Differential Voltage Feedback CMOS Amplifiers," by Arturo Tauro, et al., Electronics, Circuits and Systems, 2003, ICECS 2003, Proceedings of the 2003 10th IEEE International Conference (vol. 1) Dec. 14-17, 2003, pp. 288-291.

"A 0.5V Bulk-Input Operational Transconductance Amplifier with Improved Common-Mode Feedback," by Michael Trakimas et al., Circuits and Systems, 2007, ISCAS 2007, IEEE International Symposium, May 27-30, 2007, pp. 2224-2227.

\* cited by examiner

AMPLIFIER COMMON-MODE CONTROL METHOD

RELATED PATENT APPLICATION

This application is related to U.S. Pat. No. 8,552,801, Ser. No. 12/930,757, filed on Jan. 14, 2011, and assigned to the same assignee as the present invention.

(1) TECHNICAL FIELD

This invention relates generally to amplifiers and relates more specifically to common-mode control methods in circuits using fully-differential amplifiers with feedback networks.

(2) BACKGROUND

Differential circuit implementations are widely used for realizing mixed-signal systems owing to their ability to substantially reject (as common-mode) ambient noise signals e.g. supply noise, reference noise and substrate noise that can ruin signal integrity in single-ended circuit implementations. An issue to address when designing fully differential amplifiers is designing a common-mode voltage control loop to set the differential output common-mode voltage.

Common-mode control requires methods for both sensing and forcing the differential output voltage's common-mode voltage. Typical requirements for common-mode sensing are to achieve sense circuit linearity to avoid common-mode to differential signal conversion.

Disadvantages with prior art include high sensitivity to any offset or device matching errors, causing large common-mode dc voltage errors, and also reduced bandwidth leading to extended settling time of the common-mode control loop in response to common-mode disturbances.

It is a challenge to designers of fully differential amplifiers to overcome these disadvantages.

SUMMARY

A principal object of the present disclosure is to sense common-mode output voltage by sensing voltages at nodes in the feedback network that are not the same as the input nodes of the main amplifier in order to increase the feedback factor to both sensitivity to random offsets and mismatches, and to improve the common-mode control loop bandwidth.

A further object of the present disclosure is to use the feedback network of one or more gain stages based on using feedback around amplifiers to not only define the signal gain but also to sense common-mode voltages for common-mode voltage control.

A further object of the present disclosure is to achieve low settling time of the common-mode control loop.

A further object of the present disclosure is to reduce common-mode dc voltage errors resulting from random offsets and mismatches.

A further object of the present disclosure is to achieve common-mode sense circuit linearity to avoid common-mode to differential signal conversion.

A further object of the present disclosure is to achieve high open-loop gain of the amplifier combined with low power dissipation.

In accordance with the objects of this disclosure a fully differential amplifier system with common-mode control having reduced sensitivity to random offsets and mismatches and improved common-mode loop bandwidth, has been achieved. The amplifier system disclosed comprises a fully differential main amplifier, configured to receiving input signals via a positive input port Vip and a negative input port Vin and to generating output signals to a positive output port Vop and to a negative output port Von, wherein the main amplifier is provided with a continuous-time signal path feedback network, wherein a first terminal of a positive branch of the continuous-time signal path feedback network is connected to the positive input port Vip and a second terminal of the positive branch of the continuous-time signal path feedback network is connected to the negative output port Von, and a first terminal of a negative branch of the continuous-time signal path feedback network is connected to the negative input port Vin and a second terminal of the negative branch of the continuous-time signal path feedback network is connected to the positive output port Vop. Furthermore the amplifier system disclosed comprises an common-mode control sub-amplifier, which is configured to sensing common-mode voltages of the fully differential main amplifier at a node Vcmip within a positive branch of the continuous-time signal path feedback network and at a node Vcmin within a negative branch of the continuous-time signal path feedback network, to comparing the common-mode voltage sensed at Vcmin and Vcmip with a target reference voltage, and to regulating, depending on the result of the comparison, the output common-mode voltage via the continuous signal path feedback network.

In accordance with the objects of this disclosure a method to reduce sensitivity to random offsets and mismatches and to improve the common-mode control loop bandwidth of fully differential amplifiers has been achieved. The method disclosed comprises the steps of: (1) providing a fully differential main amplifier having a continuous-time signal path feedback network between amplifier's differential inputs and differential outputs; and (2) deploying an additional common-mode control sub-amplifier, which senses a common-mode voltage of the fully differential main amplifier at nodes within the continuous-time signal path feedback network, compares the common-mode voltage sensed with a reference voltage, and regulates depending on the result of the comparison the output common-mode voltage via the existing continuous signal path feedback network without requiring devices additional to the existing signal path network.

BRIEF DESCRIPTION OF THE DRAWINGS

In the accompanying drawings forming a material part of this description, there is shown.

DETAILED DESCRIPTION

Disclosed are embodiments of methods and circuits for common-mode control of fully differential amplifiers by determining common-mode output voltage by sensing voltages at nodes in the amplifier feedback network that are not the same as the input nodes of the main amplifier in order to increase the feedback factor to both reduce sensitivity to random offsets, and mismatches and to improve the common-mode control loop bandwidth.

By moving the sense points of the feedback network closer to the amplifier output the common-mode loop feedback factor can be increased and hence sensitivity to errors (such as offset voltages) is reduced and loop settling speed improved.

Figure 1:
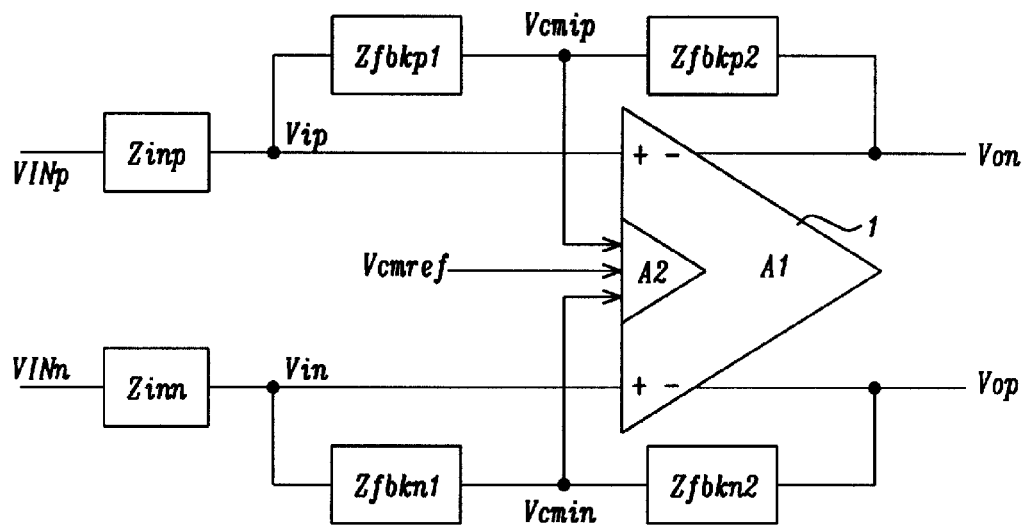
FIG. 1 shows the principles of the common-mode voltage control disclosed.

FIG. 1 shows the principles of the common-mode voltage control disclosed. The fully differential amplifier 1 shown in FIG. 1 receives differential inputs VINp and VINn via the input impedances Zinp and respectively ZINn via the feedback input nodes of the main amplifier Vip and Vin. The amplifier 1 generates the differential outputs Vop and Von. Feedback is provided on the positive side by the feedback impedances Zfdbkp1 and Zfbkp2 respectively on the negative side by feedback impedances Zfdbkn1 and Zfbkn2$p$2. The common-mode voltage feedback nodes Vcmip and Vcmin are deployed between the feedback impedances Zfdbkp1 and Zfbkp2 respectively between the feedback impedances Zfdbkn1 and Zfbkn2$p$2 and are connected to the common-mode control sub-amplifier A2. A further input to the common-mode control sub-amplifier A2 is the common mode reference voltage Vcmref.

It is important to note that the inputs to the common-mode control sub-amplifier A2 are now nodes vcmip and vcmin; these are not the same feedback nodes as used by the main amplifier A1, which are still Vip and Vin.

Assuming (for simplicity, not as a limiting requirement) that:
1. Amplifier A1 has very high open-loop gain such that the differential voltage between nodes Vip and Vin is almost zero (i.e. Vip=Vin)
2. The circuit is differentially balanced, so Zin=Zinn=Zinp, Zfkbk1=Zfbkp1=Zfbkn1 and Zfbk2=Zfbkp2=Zfbkn2
3. Only DC (and low frequencies) are used for setting the common-mode output voltage bias, so only the resistive components of all feedback network impedances: Rin, Rfbk1 and Rfbk2 are considered.

Item 1 above means there is no differential signal at nodes Vip and Vin when applying a balanced differential input at nodes Vinp and Vinn. Between nodes vcmip and vcmin there is a balanced differential signal of magnitude $$Vcmin-Vcmip=(Vinp-Vinn)\cdot[Rfbk1/Rin]$$

(where "." in the equation above and correspondently in other equations denotes a multiplication operation),
and there is a balanced differential signal at the circuit output of magnitude $$Von-Vop=(Vinp-Vinn)\cdot[(Rfbk1+Rfbk2)/Rin]$$

$$(Vinp-Vinn)\cdot[G]$$

Define common-mode voltages Vcmin and Vcmo of the amplifier input and output ports as:

$$Vcmin=(Vinp+Vinn)/2$$

$$Vcmo=(Vop+Von)/2$$

Then it follows that at the common-mode voltage at A1 input nodes Vip and Vin is:

$$VcmA1 = (Vinp + Vinn)/2 \qquad (EQ3)$$

$$[Vcmo \cdot Rin + Vcmin \cdot (Rfbk1 + Rfbk2)]/$$

$$(Rin + Rfbk1 + Rfbk2),$$

and at A2 input nodes vcmip and vcmin the common-mode voltage is:

$$VcmA2 = (Vcimp + Vcmin)/2 \qquad (EQ4)$$

$$[Vcmo \cdot (Rin + Rfbk1) + Vcmin \cdot Rfbk2]/$$

$$(Rin + Rfbk1 + Rfbk2),$$

Rearranging (EQ4) to find Vcmo when the feedback action of A2 forces VcmA2=Vcmref and Vcmin is set by the signal source driving Vinp and Vinn gives $$Vcmo=Vcmref\cdot(Rin+Rfbk1+Rfbk2)/(Rin+Rfbk1)-\\ Vcmin\cdot Rfbk2/(Rin+Rfbk1) \qquad (EQ5)$$

It is important to understand that, compared to using nodes Vip and Vin for common-mode output voltage sensing as done in prior art, the common-mode control loop feedback factor can be increased as disclosed when nodes vcmip and vcmin are used for common-mode output voltage sensing, wherein β is the feedback factor from Vcmo to Vcmsense, sensed at nodes vcmip and vcmin:

$$\beta(Vin,Vip)=Rin/(Rin+Rfbk1+Rfbk2)$$

$$\beta(Vcmin,Vcmip)=(Rin+Rfbk1)/(Rin+Rfbk1+Rfbk2)$$

$$=\beta(Vin,Vip)+Rfbk1/(Rin+Rfbk1+Rfbk2)$$

hence β(Vcmin,Vcmip)>β(Vin,Vip).

The amount by which β (Vcmin,Vcmip) can be greater than β (Vin,Vip) is limited by the ability of sub-amplifier A2 to reject small differential input signals, as will be shown now.

Figure 2:
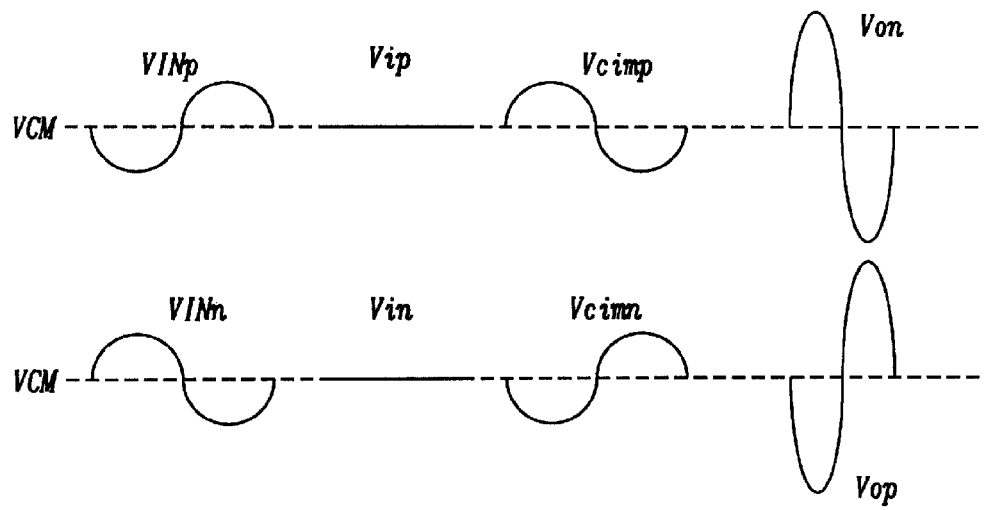
FIG. 2 depicts example differentials signals for the circuit shown in FIG. 1.

FIG. 2 gives an example illustration showing the signals at each node for a sine wave input where G=4 and (for simplicity) all common-mode voltages are to be VCM (which is a state commonly desired to be achieved, but it is not a necessary requirement or limitation). High open loop differential gain of amplifier A1 has been assumed at the signal frequency so that there is for all practical purposes no differential signal at nodes Vip and Vin.

Using the above example with G=4 to illustrate the improvements possible through using VcmA2 instead of VcmA1 to control the common-mode output voltage, e.g. β Rin=1, Rfbk1=1 and Rfbk2=3. This gives differential signal gain $$G=(Rfbk2+Rfbk1)/Rin$$

$$=4$$

as expected. However, now $$\beta(VcmA1)=Rin/(Rin+Rfbk1+Rfbk2)$$

$$=1/5$$

but $$\beta(VcmA2)=(Rin+Rfbk1)/(Rin+Rfbk1+Rfbk2)$$

$$=2/5$$

Thus the feedback factor β, and hence loop settling speed is improved by a factor of 2. The common-mode output voltage is also less sensitive to errors such as random offset errors in amplifier A2. In a case where common-mode sensing was performed using VcmA1, an input offset of −5 mV in A2 would give a common-mode output error:

$$\beta Vcmo1=(1+G)\cdot\beta Vcmref$$

$=(1+4)\cdot(-5\ mV)$ $=-25\ mV$

Now, using VcmA2 as the common-mode sense voltage:

$\beta Vcmo2=\beta Vcmref\cdot(Rin+Rfbk1+Rfbk2)/(Rin+Rfbk1)$ $=(-5\ mV)\cdot(1+1+3)/(1+1)$ $=-12.5\ mV$ Thus, sensitivity to errors is clearly reduced (in this case by the same factor as the feedback factor increase, namely by the factor 2).

It should be noted that using nodes Vcmin and Vcmip as the inputs to A2, rather than nodes Vin and Vip, introduces some differential signal at the input of A2. This is entirely acceptable provided that these signals are small enough to be rejected by A2, i.e. they are small enough to not overload the A2 input stage.

Figure 3:
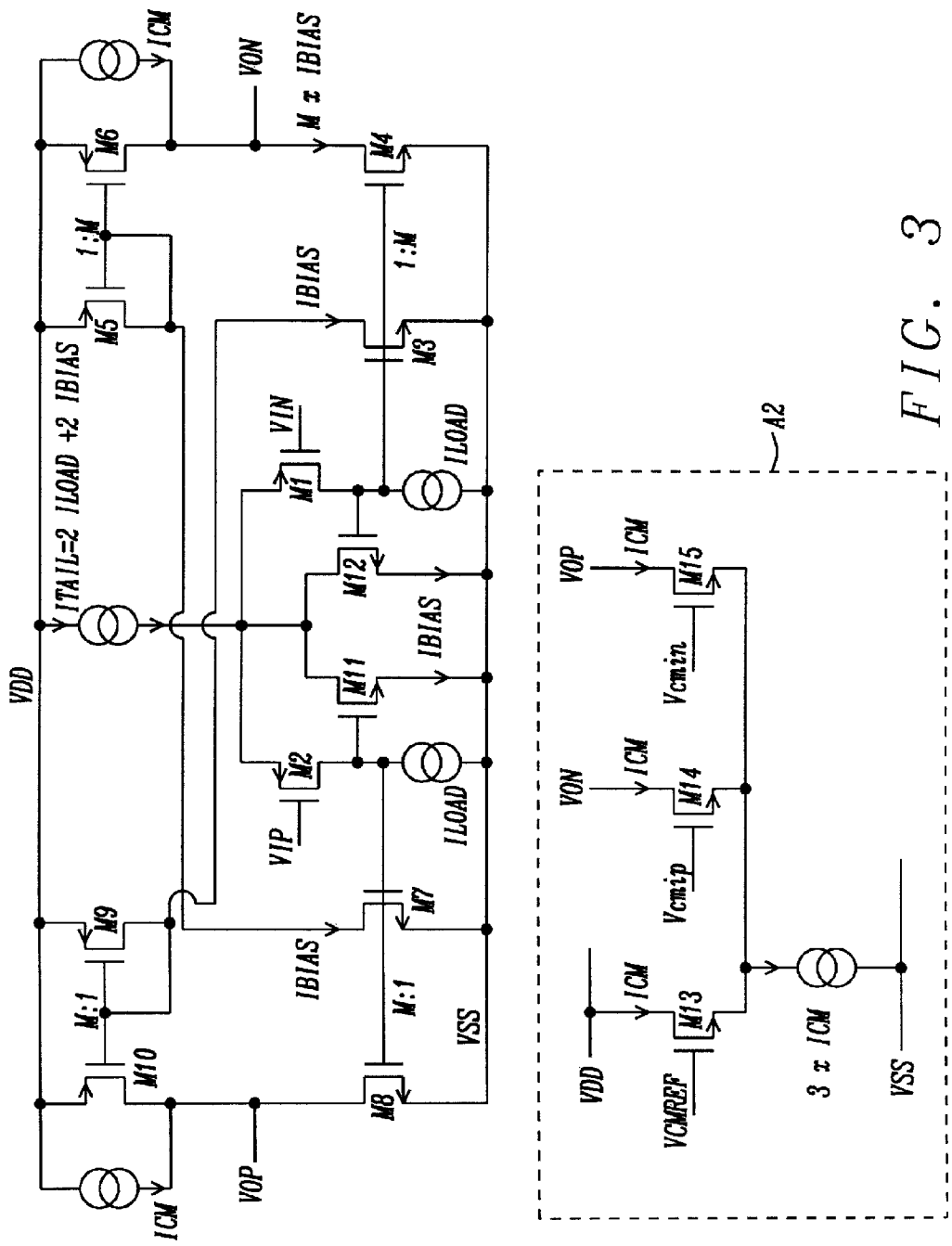
FIG. 3 illustrates an example implementation of amplifiers A1 and A2.

In order to illustrate an example implementation of the amplifiers A1 and A2 is shown in FIG. 3.

Sub-amplifier A2 is the lower circuit comprising M13, M14, and M15). Transistors M14 and M15 average the voltages (common-mode and differential) at inputs Vcmip and Vcmin and compare this average, via transistor M13, with the target common-mode reference voltage Vcmref.

The resulting drain currents of M14 and M15 provide the common-mode voltage control feedback. It should be noted that the averaging provided by M14 and M15 is effective only when any differential signal present at nodes Vcmip and Vcmin is small enough to stay within the linear differential input range of the differential pair formed by M14 and M15. This range can be, roughly, up to +/−200 mV for a typical MOSFET implementation and up to +/−3 kT/q (+/−75 mV at room temperature) for a BJT implementation.

The differential input ranges for MOS or BJTs determine how large the common-mode feedback factor can be before the signals at Vcmip and Vcmin become too large for the A2 input stage to average them. For example, for a high gain amplifier with Differential input +/−25 mV Differential gain G=20 (giving differential output +/−0.5 V) achieved by having Rin=1 and Rfbk=20.

Then the feedback factor β for an amplifier as disclosed in U.S. Pat. No. 8,552,801, Ser. No. 12/930,757, filed on Jan. 14, 2011, and assigned to the same assignee as the present invention, will be

☐β=1/(1+G)

=1/21, while for the new embodiment, allowing a linear input range for A2 of +/−75 mV, permits:

Rin=1

Rfbk1=3

Rfbk2=17

Giving a factor of 4 increase in the common-mode loop feedback factor $\beta(new)=(Rfbk1+Rin)/(Rin+Rfbk1+Rfbk2)$ $=4/21$ with corresponding reduction in the loop settling time and error sensitivity.

It should be also noted that differential signal at Vcmip and Vcmin will cause differential current components in the drain currents of M14 and M15. This is not a problem and indeed these currents can be usefully employed to, for example, boost the overall differential gain or provide part of a feed-forward transconductance frequency compensation scheme.

Figure 4:
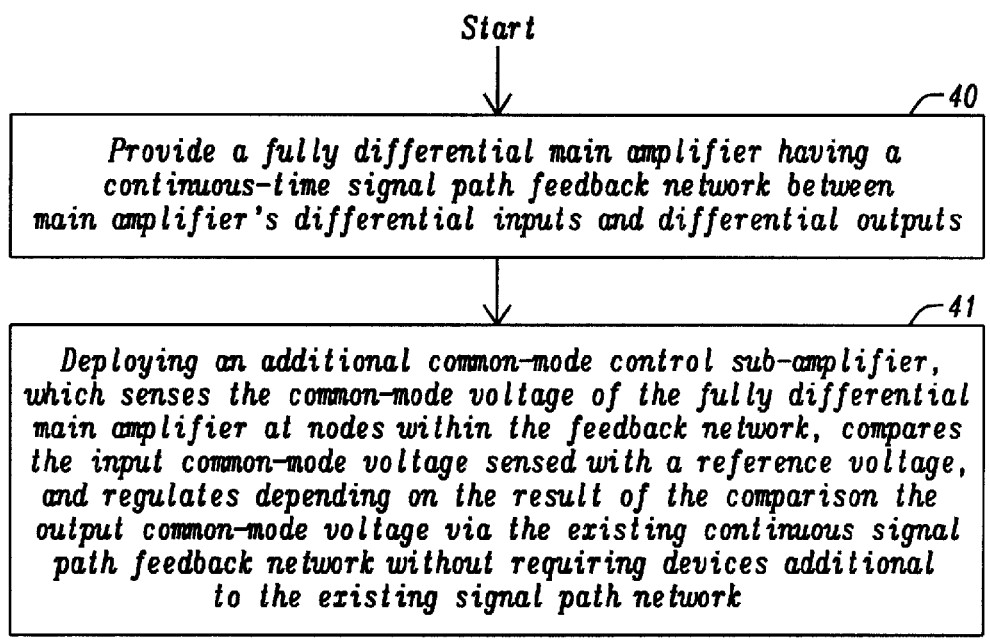
FIG. 4 shows a flowchart of a method to reduce sensitivity to random offsets and mismatches and to improve the common-mode control loop bandwidth of fully differential amplifiers.

FIG. 4 shows a flowchart of a method to reduce sensitivity to random offsets and mismatches and to improve the common-mode control loop bandwidth of fully differential amplifiers. A first step 40 illustrates provision of a fully differential main amplifier having a continuous-time signal path feedback network between amplifier's differential inputs and differential outputs. Step 41 describes deploying an additional common-mode control sub-amplifier, which senses a common-mode voltage of the fully differential main amplifier at nodes within the continuous-time signal path feedback network, compares the common-mode voltage sensed with a reference voltage, and regulates depending on the result of the comparison the output common-mode voltage via the existing continuous signal path feedback network without requiring devices additional to the existing signal path network.

It should be noted that other variations on the common-mode control principle disclosed are possible. For example, in a chain of amplifier stages, it may be possible to use the feedback network of one stage to sense the output common-mode of the previous stage. The method disclosed is also applicable to differential filtering circuits as disclosed in U.S. Pat. No. 8,552,801, Ser. No. 12/930,757, filed on Jan. 14, 2011, and assigned to the same assignee as the present invention.

In summary, the feedback network of one or more gain stages of differential amplifiers based on feedback around amplifiers to not only define the signal gain but also to sense common-mode voltages for common-mode voltage control.

While the disclosure has been particularly shown and described with reference to the preferred embodiments thereof, it will be understood by those skilled in the art that various changes in form and details may be made without departing from the spirit and scope of the disclosure.

What is claimed is:

1. A fully differential amplifier system with common-mode control having reduced sensitivity to random offsets and mismatches and improved common-mode loop bandwidth, comprising:

a fully differential main amplifier configured to receiving input signals via a positive input port Vip and a negative input port Vin, and to generating output signals to a positive output port Vop and to a negative output port Von, wherein the main amplifier is provided with a continuous-time signal path feedback network, wherein a first terminal of a positive branch of the continuous-time signal path feedback network is connected to the positive input port Vip and a second terminal of the positive branch of the continuous-time signal path feedback network is connected to the negative output port Von, and a first terminal of a negative branch of the continuous-time signal path feedback network is connected to the negative input port Vin and a second terminal of the negative branch of the continuous-time signal path feedback network is connected to the positive output port Vop; and an common-mode control sub-amplifier, which is configured to sensing common-mode voltages of the fully differential main amplifier at a node Vcmip within a positive branch of the continuous-time signal path feedback network and at a node Vcmin within a negative branch of the continuous-time signal path feedback network, to comparing the common-mode voltage sensed at nodes Vcmin and Vcmip with a target reference voltage, and to regulating, depending on the result of the comparison, the output common-mode voltage via the continuous signal path feedback network.

2. The fully differential amplifier system of claim 1, wherein the common-mode control sub-amplifier is configured to averaging the common mode voltages and the differential voltages sensed at the nodes within the continuous-time signal path feedback network and to comparing the voltage average with the common-mode reference voltage.

3. The fully differential amplifier system of claim 2, wherein the common-mode control sub-amplifier comprises:
- a first transistor connected between the positive output port Von and a first terminal of a current source, wherein a gate of the first transistor is connected to the node Vcmip;
- a second transistor connected between the negative output port Vop and the first terminal of the current source, wherein a gate of the second transistor is connected to the node Vcmin; wherein both first and second transistors are configured for averaging common-mode voltages and differential voltages at the node Vcmip respective at the node Vcmin and to compare via a third transistor an average of the voltages of both nodes Vcmin and Vcminp with the common mode reference voltage;
- said third transistor connected between the positive supply voltage VDD and the first terminal of the current source, wherein a gate of the third transistor is connected to the common mode reference voltage Vcmref;
- wherein both first and second transistors are configured that resulting drain currents of the first and the second transistor provide a common mode control feedback.

4. The fully differential amplifier system of claim 3, configured to boosting an overall differential gain of the fully differential amplifier system or to providing a part of a feed-forward transconductance scheme by using differential current components in the drain currents of the first and second transistor caused by differential signals at the nodes Vcmip and Vcmin.

5. A method to reduce sensitivity to random offsets and mismatches and to improve the common-mode control loop bandwidth of fully differential amplifiers, comprising the steps of:

(1) providing a fully differential main amplifier having a continuous-time signal path feedback network between amplifier's differential inputs and differential outputs; and (2) deploying an additional common-mode control sub-amplifier, which senses a common-mode voltage of the fully differential main amplifier at nodes within the continuous-time signal path feedback network, compares the common-mode voltage sensed with a reference voltage, and regulates depending on the result of the comparison the output common-mode voltage via the existing continuous signal path feedback network without requiring devices additional to the existing signal path network.

6. The method of claim 5, wherein the common-mode control sub-amplifier is configured to averaging the common mode voltages and the differential voltages sensed at the nodes within the continuous-time signal path feedback network and to comparing the voltage average with the common-mode reference voltage.

7. The method of claim 5, further comprising boosting an overall differential gain of the fully differential amplifier system by using differential current components in currents of transistors of the additional common-mode control sub-amplifier, which are caused by differential signals at the nodes within the continuous-time signal path feedback network used for sensing the common mode voltages.

8. The method of claim 5, further comprising providing a part of a feed-forward transconductance scheme by using differential current components in currents of transistors of the additional common-mode control sub-amplifier, which are caused by differential signals at the nodes within the continuous-time signal path feedback network used for sensing the common mode voltages.

9. The method of claim 5, wherein the method is applied to a chain of amplifier stages.

10. The method of claim 9, wherein the continuous-time signal path feedback network of one stage is used to sense the output common-mode of the previous stage.

11. The method of claim 5, wherein the method is used for to differential filtering circuits.

* * * * *